US005963565A

United States Patent [19]

Rezvani et al.

[11] Patent Number: 5,963,565

[45] Date of Patent: *Oct. 5, 1999

[54] APPARATUS AND METHOD FOR EXTERNAL SUPERVISION OF ELECTRONIC TEST EQUIPMENT OPERATING PARAMETERS

[75] Inventors: Saiid Rezvani, Los Gatos; Bruce Chiu, Fremont, both of Calif.

[73] Assignee: Altera Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/739,870

[22] Filed: Oct. 31, 1996

Related U.S. Application Data

[60] Provisional application No. 60/027,119, Sep. 30, 1996.

[51] Int. Cl.$^{6}$ .................................................. G06F 19/00

[52] U.S. Cl. ........................................ 371/22.1; 702/123

[58] Field of Search ......................... 364/580; 371/22.1, 371/22.31, 22.4; 702/118, 119, 121, 123

[56] References Cited

U.S. PATENT DOCUMENTS

| | | | |
|---|---|---|---|
| 5,036,479 | 7/1991 | Prednis et al. | 364/580 |
| 5,606,568 | 2/1997 | Sudweeks | 371/22.34 |
| 5,638,383 | 6/1997 | Wotzak et al. | 371/22.5 |

*Primary Examiner*—William M. Treat
*Attorney, Agent, or Firm*—William S. Galliani; Pennie & Edmonds LLP

[57] ABSTRACT

An apparatus to supervise the testing of electronic components includes a computer storing a command file with an electronic component test instruction. A communication link is connected to the computer. An electronic component testing apparatus is connected to the communication link to return electronic component test status information to the computer over the communication link when the electronic component testing apparatus executes a specified operation corresponding to the electronic component test instruction of the command file.

1 Claim, 3 Drawing Sheets

30

32

Electronic Component Testing Equipment

34

Input/Output Devices

26

36

38A

Network Computer

38B

Network Computer

O O O

40

APPARATUS AND METHOD FOR EXTERNAL SUPERVISION OF ELECTRONIC TEST EQUIPMENT OPERATING PARAMETERS

This application claims priority to the provisional application entitled "Apparatus and Method for External Supervision of Electronic Test Equipment Operating Parameters", serial number 60/027,119, filed Sep. 27, 1996.

BRIEF DESCRIPTION OF THE INVENTION

This invention relates generally to electronic test equipment that is used to test electronic components. More particularly, this invention relates to the use of a command file generated on a computer of a network of computers attached to the electronic test equipment that allows the network of computers to remotely supervise the operation of the electronic test equipment.

BACKGROUND OF THE INVENTION

FIG. 1 illustrates electronic component testing equipment 20 of the type known in the art. By way of example, the electronic component testing equipment or apparatus 20 may be the MEGAONE™ or VOYAGER™ electronic component testing equipment sold by MEGATEST™, Corporation, San Jose, Calif. These devices are typically used to test the performance of digital circuits. Typical electronic component testing equipment 20 has a set of input devices 22 including a test head which interacts with the electronic component that is being tested, a keyboard to input test commands, and a mouse to select various executable operations. Electronic component testing equipment 20 also includes output devices 24, typically in the form of a computer monitor and printer to display test results. A human operator 26 works at the electronic component testing apparatus 20 to input test commands and to assess the generated output.

A problem associated with electronic component testing equipment of the type shown in FIG. 1 is that command inputs to the equipment and data output from the equipment are limited to the operator 26. In other words, prior art electronic component testing equipment does not allow an individual, for instance remotely located at a different company facility, to produce command inputs to the electronic component testing equipment 20 or to receive data output in response to selected operations that are performed by the electronic component testing equipment 20. It would be highly desirable to extend the functionality of existing electronic component test equipment to accommodate external supervision of the electronic component test equipment operating parameters.

SUMMARY OF THE INVENTION

An apparatus to supervise the testing of electronic components includes a computer storing a command file with an electronic component test instruction. A communication link is connected to the computer. An electronic component testing apparatus is connected to the communication link to return electronic component test status information to the computer over the communication link when the electronic component testing apparatus executes a specified operation corresponding to the electronic component test instruction of the command file.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
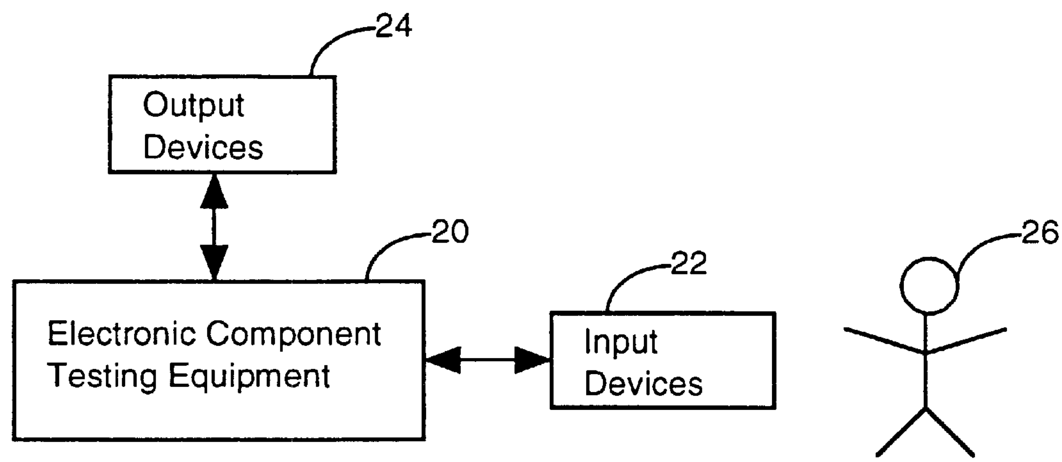
FIG. 1 illustrates an electronic component testing device in accordance with the prior art.
Figure 2:
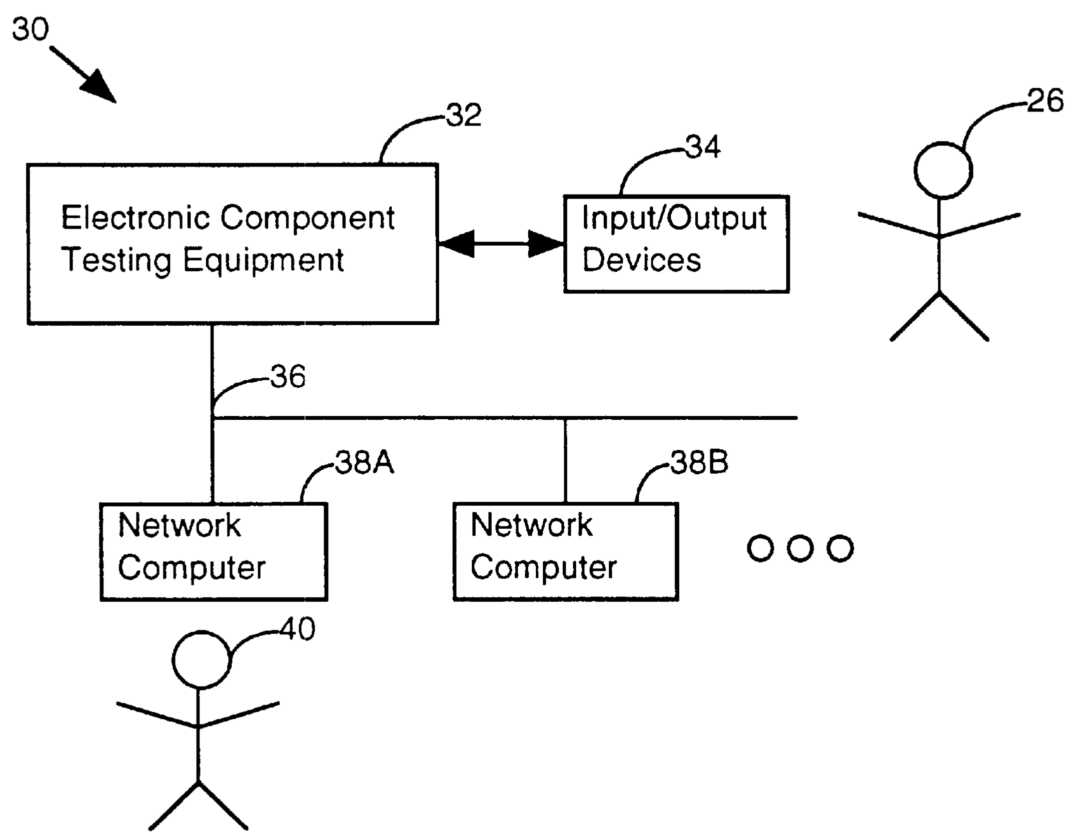
FIG. 2 illustrates an apparatus for the external supervision of electronic test equipment operating parameters in accordance with an embodiment of the invention.

FIG. 2 illustrates an apparatus 30 in accordance with an embodiment of the invention. The apparatus 30 includes electronic component testing equipment 32 and associated input and output devices 34. The apparatus 30 also includes a communication link 30, which may be any wire or wireless communication channel, for connection to one or more remotely located computers 38. By way of example, FIG. 2 illustrates a first network computer 38A and a second network computer 38B, both of which are positioned at a location that is remote from the electronic component testing equipment 32. A "remote location" is any location outside of the vision of the operator 26. Typically, the remote location will be on a floor of a building that is distinct from the floor that holds the electronic component testing equipment 32. More typically, the remote location will be in a different building altogether. Indeed, the present invention has been implemented with the electronic component testing equipment 32 and the network computer 38A existing on separate continents.

FIG. 2 also illustrates an operator 40 working with the network computer 38A. In accordance with the invention, the operator 40 can externally (or remotely) supervise the operating parameters of the electronic test equipment 32. That is, the operator 40 can actively generate test commands for execution by the electronic component testing equipment 32. In addition, the operator 40 can actively supervise the electronic component testing equipment 32 by dynamically receiving data output when selected operations are performed by the electronic component testing equipment 32. These features of the invention will be described further below.

Figure 3:
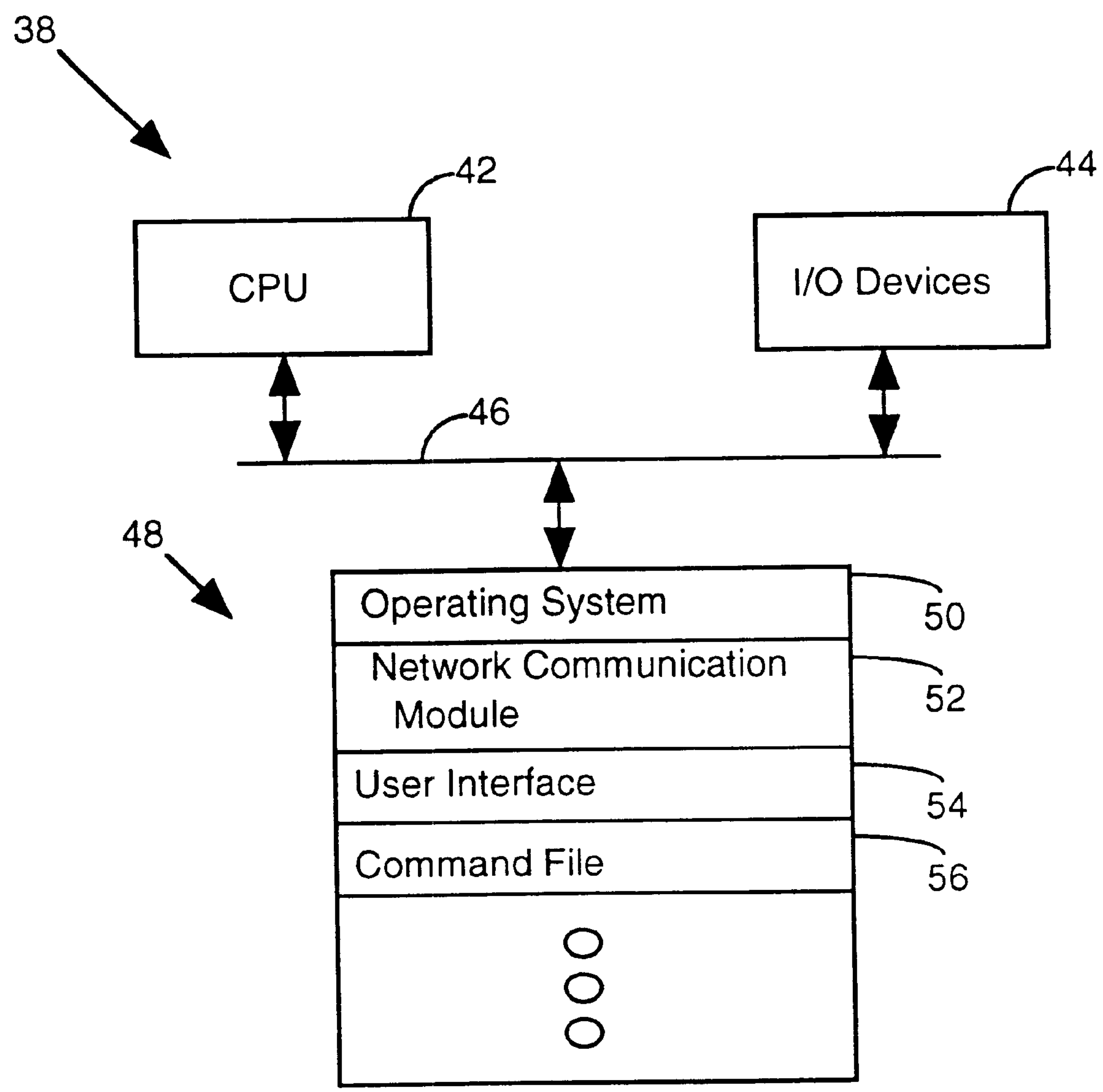
FIG. 3 illustrates an embodiment of a network computer that may be used in the apparatus of FIG. 2.

FIG. 3 illustrates a computer 38 that may be used in an embodiment of the invention.

The computer 38 includes a central processing unit (CPU) 42 connected to a set of input and output devices 44 by a system bus 46. The CPU 42 also is connected to a memory 48 via the system bus 46. The interaction of a CPU 42, input and output devices 44, a system bus 46, and a memory 48 is known in the art. The present invention is directed toward the particular set of executable instructions that are stored in the memory 48 and executed by the CPU 42.

The memory 48 includes an operating system 50, a network communication module 52, and a user interface 54. Operating systems, network communication modules, and user interfaces are known in the art. Any number of prior art systems may be used in accordance with the invention. These prior art systems are used to generate and transport a command file 56 in accordance with the invention. That is, the user interface 54 is used to receive command file instructions in accordance with the invention. The network communication module 52 is used to pass the command file to the electronic component testing equipment 32. All of these operations are supervised by the operating system 50.

Figure 4:
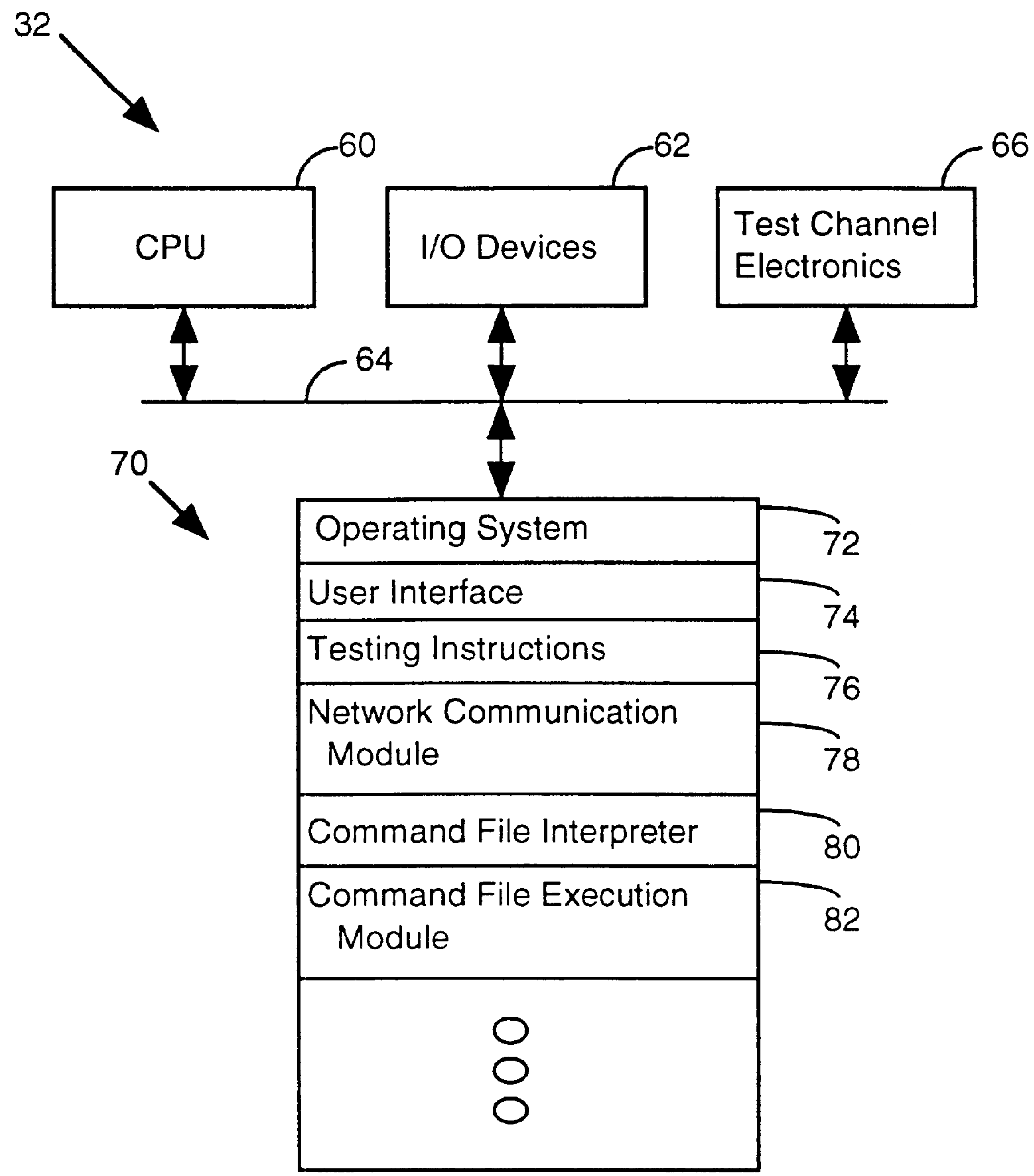
FIG. 4 illustrates an embodiment of an electronic test equipment apparatus that may be used in the apparatus of FIG. 2.

FIG. 4 illustrates electronic component testing equipment 32 in accordance with an embodiment of the invention. The equipment 32 includes known elements of a CPU 60, input and output devices 62, test channel electronics 66, and an associated memory 70. Prior art electronic component testing equipment 32 includes executable programs, such as an operating system 72, a user interface 74, and a set of testing instructions 76. In accordance with the present invention, these standard executable programs in memory 70 are supplemented with network communication module 78, a command file interpreter 80, and a command file execution module 82. The network communication module 78 is used to achieve standard network communications. The command file interpreter 80 is used to process the command file 56 passed to it from a network computer 38. The command file execution module 82 interacts with the command file interpreter 80 to transform the commands in the command file 56 into operations that are executed by the electronic test equipment 32.

The invention provides the capability to execute a number of external supervision activities. Sample external supervision activities include:

(1) Display a message to the operator 26 if a wrong flow (plastic vs ceramic) is selected for a particular lot, and guide the operator to make the correct flow selection. Both the flow name and the lot number may be specified in the command file.

(2) Send mail to a product engineer when a particular lot begins.

(3) Send mail to a product engineer if the yield on a lot is below some limit.

(4) Display a file on the screen when a particular lot or any lot of the specified device type and flow is started. This file could contain special instructions that the engineer would want the operator to follow for this lot or device until further notice. The full name of the instruction file, the flow name, and the lot number may be given in the command file.

(5) Direct the program to datalog every Kth part into a file for a specified lot or any lot of a specified device type. This approach may be used by product engineers to collect sample data on a temporary basis.

(6) Display a message to the operator if yield is below a stop-limit value specified in the command file and prompt the operator to take certain action.

(7) Display a message to the operator and guide him to take certain action if the temperature selected is different from what is specified for a flow in the command file.

(8) Direct the program to take certain action (such as: send mail, display message, pause, etc.) if down binning is beyond some maximum limit.

(9) Execute a command script if a certain condition is met.

Each of the foregoing example external supervision activities may be specified in a command file 56. As indicated above, the command file 56 is generated on a network computer 38A through the use of a user interface 54. The command file is then passed to the electronic component testing equipment 32 via the communication link 36. That is, the network communication module 52 of the network computer 38 passes the command file 56 to the electronic component testing equipment 32, which initially processes it through its network communication module 78. The command file 56 is then stored in the memory 70. Most electronic component testing equipment 32 has a specified directory that is accessed each time the machine operates in production mode. The command file 56 is given a file name or file extension which is automatically invoked by the testing equipment 32 when it is operating in production mode. The testing equipment typically searches the subject directory at the beginning of a production run, every time the setup is changed, and once after every M parts are tested. The value M may be assigned a default value.

The following information is specific to an implementation of the invention on a MEGAONE™ electronic component testing device, sold by MEGATEST™, Corporation, San Jose, Calif. In this particular device, the command file is given an "ECF" file extension. Such files are placed in the directory "/prod1/ECF."

A command file 56 in accordance with the invention includes a series of "if" statements. The format observed by the invention is as follows:

```
if (logical expression)
    {
      directive ;
      directive ;
        . . .
    }
```

The following rules are observed regarding the "if" statements as used on the MEGAONE ™ electronic component testing device:

(1) ECF files are case sensitive. The word "if", all logical expression parameters and variables, and all directives must be of proper case.

(2) All directives must always be enclosed by braces '{' and '}'. If an "if" statement applies to only one directive, that directive must still be enclosed by braces.

(3) Each directive must be terminated by a ','.

(4) The following logical expressions may be used: <, <=, ==, >=, >!=(not equal), ~(contains), Δ~(does not contain).

(5) The following Boolean operators may be used:

II (or), && (and), !(not).

(6) The following arithmetic operators may be used: +, −, *, /, % (modulus) , ^(exclusive or), ** (exponentiation).

(7) All string values must by enclosed by double quotes, e.g. "myname".

(8) Logical and assignment expressions that span more than one line must use a line continuation character '\'.

Several parameters and variables are accessible through the command files used on the MEGAONE ™ electronic component testing device. These parameters (read only) and variables (read and write) are marked by '$' and are listed below:

OUTPUT Variables

| Parameter Name | Type | Example |
|---|---|---|
| $ProgramName | string | "464", "5064", "7128E", etc. |
| $LotID | string | "CAB403752", etc. |
| $TestFlow | string | "PCHFT", etc. |
| $Package | string | "PLASTIC" or "CERAMIC" only |
| $TestMode | string | "production_units" or "rejects" only |
| $Temperature | integer | between −200 and +200 |

-continued

| | | |
|---|---|---|
| $OperatorID | string | "realuserid", etc. |
| $LoadBoardID | string | "12", "P5", etc. |
| $DUTCardID | string | "3", "G", etc. |
| $HandlerType | string | "NONE" or "ASECO" or "TL50" etc. |
| $HandlerID | string | "5", "H5" |
| $HostName | string | "prince", "sleepy", etc. |
| $HeadNumber | string | "Head 1", "Head2", "NoHead" |
| $ContactorID | string | "1", "X", etc. |
| $LotSize | integer | positive integer |
| $TotalTested | integer | positive integer |
| $TotalPassed | integer | positive integer |
| $TotalBin1 | integer | positive integer (hard bin 1) |
| $TotalBin2 | integer | positive integer (hard bin 2) |
| $TotalBin3 | integer | positive integer (hard bin 3) |
| $TotalBin4 | integer | positive integer (hard bin 4) |
| $TotalBin5 | integer | positive integer (hard bin 5) |
| $TotalBin6 | integer | positive integer (hard bin 6) |
| $TotalBin7 | integer | positive integer (hard bin 7) |
| $TotalBin8 | integer | positive integer (hard bin 8) |
| $TotalSBin1 | integer | positive integer (1st soft bin on the program list) |
| $TotalSBin2 | integer | positive integer (2rd soft bin on the program list) |
| $TotalSBin3 | integer | positive integer (3rd soft bin on the program list) |
| $TotalSBin4 | integer | positive integer (4th soft bin on the program list) |
| $IsFinalSummary | integer | boolean 0 or 1 |
| $IsPreMarkLot | integer | boolean 0 or 1 |
| $IsProduction | integer | boolean 0 or 1 |
| $IsEngrRelease | integer | boolean 0 or 1 |
| $WaitTime | integer | positive integer (seconds, sum of seconds which the system is waiting for the user to enter data.) |
| $DeviceTestTime | integer | positive integer (micro-seconds, average test time of the good units) |
| $HandlerIndexTime | integer | positive integer (micro-seconds, handler index time excludes hander jams.) |
| $AveTestTime | integer | positive integer (micro-seconds, average test time of good and bad units) |
| $AveIndexTime | integer | positive integer (micro-seconds, average index time includes jams) |
| $PreMarkLotName | string | "Unmarked__Lot", "Dash-15", "Dash-25", etc. |
| $ProgStartTime | integer | positive integer (seconds since Jan 1, 1970 UTC) |
| $AutoTime | integer | positive integer (seconds, The time for AutoPrompt) |
| $LoadTime | integer | positive integer (seconds, The time where the program initializing DeviceTable, PinLists, DCTables, ACTables, CycleTables . . . until the Test Menu shows up.) |
| $PrepTime | integer | positive integer (seconds, The time begins when TestMenu first shows up and ends when the user press <T> to start testing the lot). |
| $LotTTime | integer | positive integer (seconds, The period between pressing the <Test Command> and pulling the Summary) |
| $ECFCounter | integer | positive integer (# of times ECF has been read). |

INPUT/OUTPUT Variables include

| Parameter Name | Type | Example & Description |
|---|---|---|
| $ECFSpareVariable0 | integer | any integer |
| $ECFSpareVariable1 | integer | any integer |
| $ECFSpareVariable2 | integer | any integer |
| $ECFSpareVariable3 | integer | any integer |
| $ECFSpareVariable4 | integer | any integer |
| $ECFSpareVariable5 | integer | any integer |
| $ECFSpareVariable6 | integer | any integer |
| $ECFSpareVariable7 | integer | any integer |
| $ECFSpareVariable8 | integer | any integer |
| $ECFSpareVariable9 | integer | any integer |
| $HowOftenPARTIAL | integer | integer >50 (default 1000) |
| $HowOftenECF | integer | integer >50 (ciefault 1000) |
| $HowOftenDATALOG | integer | integer >50 (defauit 250) |

The variables $ECFSpareVariable0 through $ECFSpareVariable9 are provided to be used as counters, flags, or any other scratch variables by the command file 56. These variables are stored as __A__ECFSpareVariable0through __A__ECFSpareVariable9 in the Pascal programming language. Therefore, it is possible to pass values to a running program through command files using these variables. This approach, however, should be used with caution if critical test parameters are altered by these variables. The statement $HowoftenPARTIAL controls how often the program dumps a partial summary to a file named /prod1/RUNNING__PRGM/host.head, where host is the tester name and head is the head name. The value is initially set to 250, indicating a partial summary once at the beginning and once after testing every 250 parts. The statement $HowOftenECF controls how often the program reads the command file. The statement $HowOftenDATALOG controls how often the program collects characterization data.

Below is a list of directives that may be used in accordance with the invention. Each directive includes a brief description. The characters '[]' indicate optional parameters. All directives must be terminated by a ','.

SendMail username message;

Mails the text of a message to the user username.

MailFile username filename;

Mails the file filename to the username.

StopProgram [message];

Stops the program immediately. The optional message will be displayed to the operator.

DisplayMessage message;

Displays the message to the operator.

DisplayFile filename;

Displays the contents of the filename on the screen.

PrintFile [options] filename;

Prints the file filename on a printer. Options could be "-Pep".

RunScript filename [params];

Runs script file for the filename. Optional parameters could be passed on to the script.

DumpPartial filename;

Dumps a partial summary to the file specified by the filename.

In the foregoing assignment statements, any integer expression may be used on the right hand side. For example, both '=' and ':=' are acceptable.

The foregoing variables and directives can be combined into a command file 56 generated on a network computer 38. In other words, electronic component test instructions can be formulated from the foregoing variables an directives. The electronic component test instructions are then placed in a command file. The command file 56 is then passed over the communication link 36 to the electronic component testing equipment 32. The command file interpreter 80 processes the electronic component test instructions to implement the specified functions. The following is a variety of examples illustrating the operation of the invention.

EXAMPLE 1

```
if (($LotID ~ “CAB11231”) && ($Temperature != 125))
    {
        DisplayMessage
            You have selected the wrong temperature setting for
            this lot. Temperature $Temperature should be changed
            to 125.
        ;
        StopProgram Please reload the program using the
        correct temperature. ;
    }
```

The instructions of example I are used to insure that a specific lot runs at a specified temperature. The first condition of the “if” clause checks whether the specified lot (“$LotID”) contains (“~”) the specific lot (“CAB 11231”). The second condition of the “if ” clauses checks whether the temperature is not set to 125. If the specific lot is present and the temperature is not set to 125, then a message is displayed. As shown, the message indicates that the wrong temperature has been selected. The “$Temperature” variable is displayed so that the user can see the set temperature. Instructions to reload the program are also displayed to the user.

EraseECF;

Stops reading the ECF file and erases it from the testers local directory.

Break;

Stops reading the rest of the ECF file immediately. The ECF file will still exist and will be read once $HowOftenECF units have been tested.

CreateFile filename text;

Creates the file under the given filename that contains the predefined text.

ShellCmd<unix shell command | program name> [params];

Executes any external commands.

SegReplDBtools;

Segment Replace the dbtools.p which resides in/prod1/utils__proj/<$ProgramName> and executes the procedure __A__ECF__Configuration;

$HowOftenECF=int__expression;

$HowOftenPARTIAL=int__expression;

$HowOftenDATALOG=int__expression;

$ECFSpareVariable0=int__expression;

$ECFSpareVariable1=int__expression;

$ECFSpareVariable2=int__expression;

$ECFSpareVariable3=int__expression;

$ECFSpareVariable4=int__expression;

SECFSpareVariable5=int__expression;

$ECFSpareVariable6=int__expression;

$ECFSpareVariable7=int__expression;

$ECFSpareVariable8=int__expression;

$ECFSpareVariable9=int__expression;

EXAMPLE II

```
if(1 == 1)
    {
        SendMail usemame Lot $LotID of your device started
        testing on head $HeadNumber of $HostName. ;
    }
```

The condition clause of the “if” statement of example II is always true. Therefore, the subsequent instruction will always be executed. In particular, mail will be sent to a user (“username”) indicating that a specific lot (“$LotID”) has started on a specific test head (“$HeadNumber”) of a specific test device (“$HostName”).

EXAMPLE III

```
if(($TotalTested >100) && \
    ($TotalBin5 / $TotalTested > 0.1))
    {
    DisplayMessage Something is wrong with your setup.
        Please check the hardware. There are too many opens.
    ;
    }
```

In example III, the first condition of the “if ” clause checks to determine whether more than 100 devices have been tested. The second condition checks whether the number of units in the fault bin “$TotalBin5” divided by the total number of tested devices ($TotalTested) is greater than 10%. If so, an error exists and the following message is displayed: “Something is wrong with your setup. Please check the hardware. There are too many opens.”

EXAMPLE IV

```
if (($TotalTested > 100) && ($ECFSpareVariable2 < 5))
    {
        $ECFSpareVariable2 = $ECFSpareVariable2 + 1;
        DumpPartial/prod1/MyDirectory/Summay$ECFSpareVariable2;
        SendMail username
            Summary number $ECFSpareVariable2 created. ;
    }
```

In example IV a test is initially made to determine whether more than 100 devices have been tested. In addition, a test is made to determine whether the variable “$ECFSpareVariable2” is less than 5. If both conditions are true, the variable is incremented. Then, a report is dumped to a specified file. Next, the specified file is sent to a user “username”.

EXAMPLE V

```
if ($ECPSpareVariable2 >= 5)
    {
        SendMail username
            There are 5 summaries collected at $HowOftenECF
            intervals for your review.
        ;
        $HowOftenECF = 300;
        EraseECF;
    }
```

The code of example V is executed when the variable “$ECFSpareVariable2” is equal to or greater than 5. This code is executed when the processing of example IV is completed. The code results in a user “username” receiving mail indicating that reports have been generated. The “$HowOftenECF” variable indicates the sampling rate of reading the file. The “EraseECF” command destroys the code of examples IV and V after it has been executed.

EXAMPLE VI

```
if ($LotID ~ “ACA”)
    {
        DisplayFile/prod1/SomeDirectory/SomeFile ;
        PrintFile/prod1/SomeDirectory/SomeFile;
        DisplayMessage
```

-continued

```
        This lot requires special setup. Please read the
        instructions above. A copy ofthese instructions
        is also printed for you.
    ;
}
```

In this example, the "if" clauses determines whether the lot "ACA" is being executed. If so, a specified file is displayed and printed. In addition, the following message is displayed: "This lot requires special setup. Please read the instructions above. A copy of these instructions is also printed for you."

EXAMPLE VII

```
if( $LoadBoardID == "6")
    {
        DisplayMessage
            Hi $OperatorID! I think you better stay away from
            load board $LoadBoardID. It is very flaky.;
    }
```

In this example, the command file checks to determine whether a specific load board is being used. If so, a warning message is displayed for the operator.

EXAMPLE VIII

```
if ($OperatorID == "TheNewGuy")
    {
        SendMail username
            You better rush down to the test floor. The new guy
            is setting up your lot again. ;
    }
```

In this example, mail is sent to an individual when a specific operator is running the equipment.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An apparatus to supervise the testing of electronic components, comprising:

a computer storing an external supervision command file to monitor an electronic component testing apparatus for the execution of a specified electronic component test instruction;

a communication link connected to said computer;

an electronic component testing apparatus connected to said communication link, said electronic component testing apparatus being configured to execute a program defining a predetermined set of operations to be performed on electronic components and to dynamically respond to said external supervision command file so as to dynamically return electronic component test status information to said computer over said communication link when said electronic component testing apparatus executes said electronic component test instruction defined in said external supervision command file;

wherein said external supervision command file includes a plurality of electronic component test instructions; and wherein said plurality of electronic component test instructions are selected from the group including a send mail directive, a mail file directive, a stop program directive, a display message directive, a display file directive, a print file directive, a run script directive, a dump partial file directive, an erase external command file directive, a break directive, and a create file directive.

* * * * *